(12) United States Patent
Nishida et al.

(10) Patent No.: US 6,505,340 B2
(45) Date of Patent: Jan. 7, 2003

(54) CIRCUIT SYNTHESIS METHOD

(75) Inventors: Koichi Nishida, Tenri (JP); Kazuhisa Okada, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 218 days.

(21) Appl. No.: 09/728,075

(22) Filed: Dec. 4, 2000

(65) Prior Publication Data

US 2001/0011363 A1 Aug. 2, 2001

(30) Foreign Application Priority Data

Jan. 28, 2000 (JP) ........................................ 2000-020974

(51) Int. Cl.$^7$ ................................................ G06F 17/50
(52) U.S. Cl. ................................................ 716/18; 716/2
(58) Field of Search ............................. 716/1–6, 10–18

(56) References Cited

U.S. PATENT DOCUMENTS

| 5,502,645 A | * | 3/1996 | Guerra et al. | 714/733 |
| 5,513,118 A | * | 4/1996 | Dey et al. | 714/726 |
| 5,541,849 A | * | 7/1996 | Rostoker et al. | 716/18 |
| 5,638,290 A | | 6/1997 | Ginetti et al. | 716/2 |
| 5,648,909 A | | 7/1997 | Biro et al. | 716/6 |
| 5,675,728 A | | 10/1997 | Kunda | 714/28 |
| 5,831,864 A | * | 11/1998 | Raghunathan et al. | 716/2 |
| 6,195,786 B1 | * | 2/2001 | Raghunathan et al. | 716/2 |
| 6,360,355 B1 | * | 3/2002 | Nishida et al. | 716/18 |
| 6,363,520 B1 | * | 3/2002 | Boubezari et al. | 716/18 |

FOREIGN PATENT DOCUMENTS

JP 5-101141 4/1993

OTHER PUBLICATIONS

Bergamaschi, R.A., "The Effects of False Paths in High–Level Synthesis," 1991, Digest of Technical Papers, pp. 80–83, 1991 IEEE International Conference on Computer–Aided Design (ICCAD91).

Kountouris, A.A. et al., "False Path Analysis Based on a Hierarchical Control Representation," 1998, pp. 55–59, Proceedings of 11th International Symposium on System Synthesis.

\* cited by examiner

*Primary Examiner*—Matthew Smith
*Assistant Examiner*—Paul Dinh
(74) *Attorney, Agent, or Firm*—Birch, Stewart, Kolasch & Birch, LLP

(57) ABSTRACT

A circuit synthesis method includes the steps of converting a behavioral description describing a behavior of calculation processing into a control data flowgraph; assigning at least one calculation, at least one input and at least one output in the control data flowgraph into prescribed time slots; assigning the at least one calculation, a plurality of data dependency edges, the at least one input and the at least one output respectively to at least one calculation device, at least one register, at least one input pin and at least one output pin; generating a plurality of paths corresponding to the plurality of data dependency edges; and detecting a first false path among the plurality of paths.

7 Claims, 18 Drawing Sheets

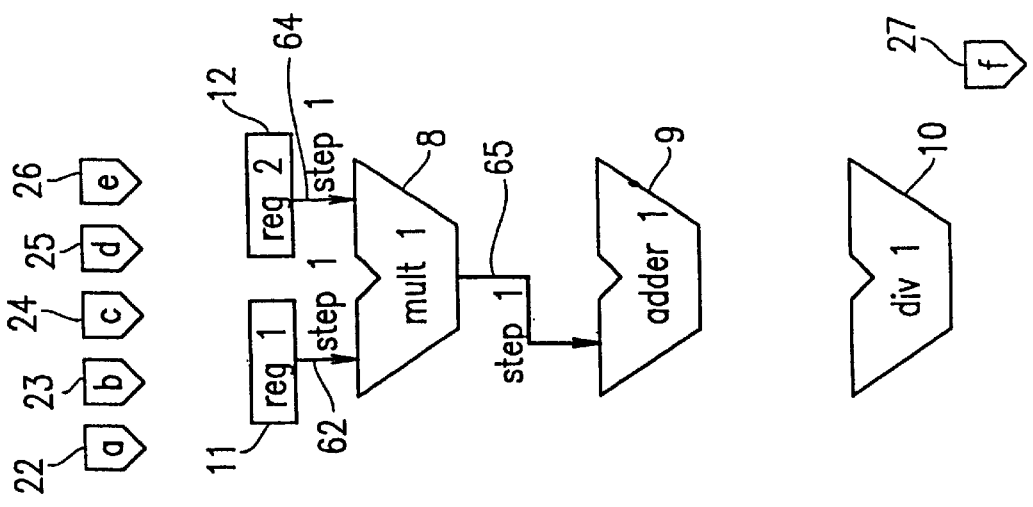
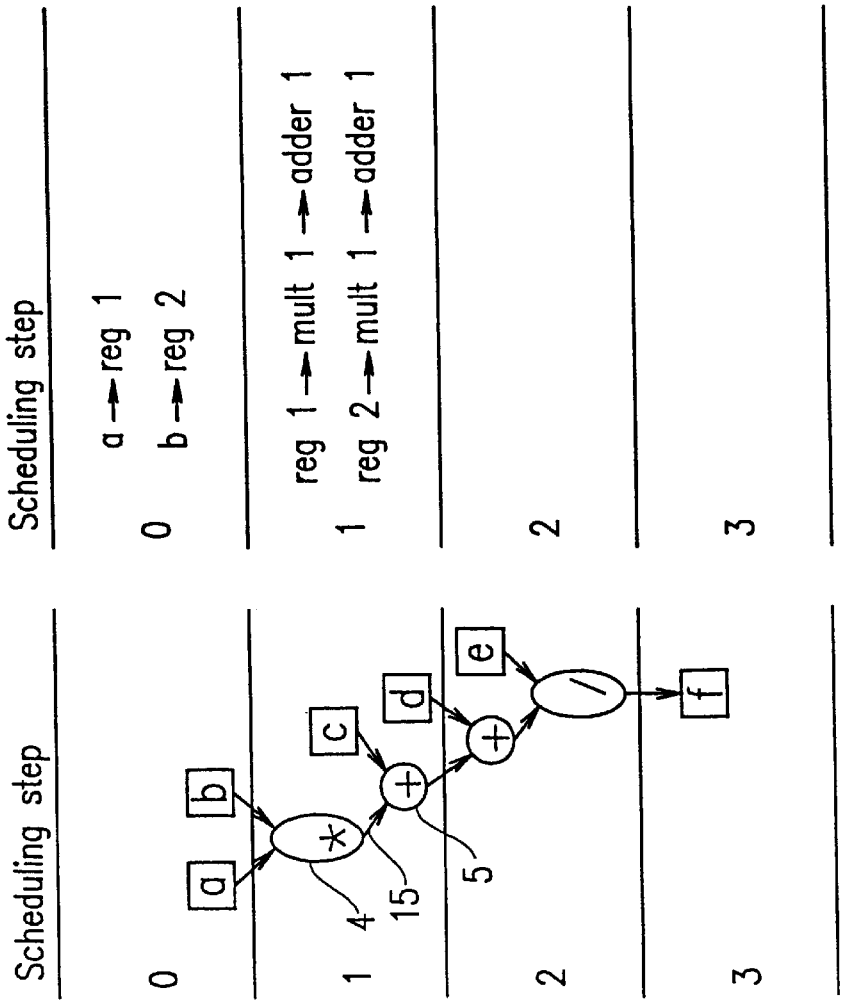
FIG. 12

| Scheduling step | |
|---|---|
| 0 | a → reg 1<br>b → reg 2 |
| 1 | reg 1 → mult 1 → adder 1 → reg 1<br>reg 2 → mult 1 → adder 1 → reg 1<br>c → adder 1 → reg 1<br>d → reg 2 |
| 2 | reg 1 → adder 1 → div 1 → reg 1<br>reg 2 → adder 1 → div 1 → reg 1<br>e → div 1 → reg 1 |
| 3 | reg 1 → f |

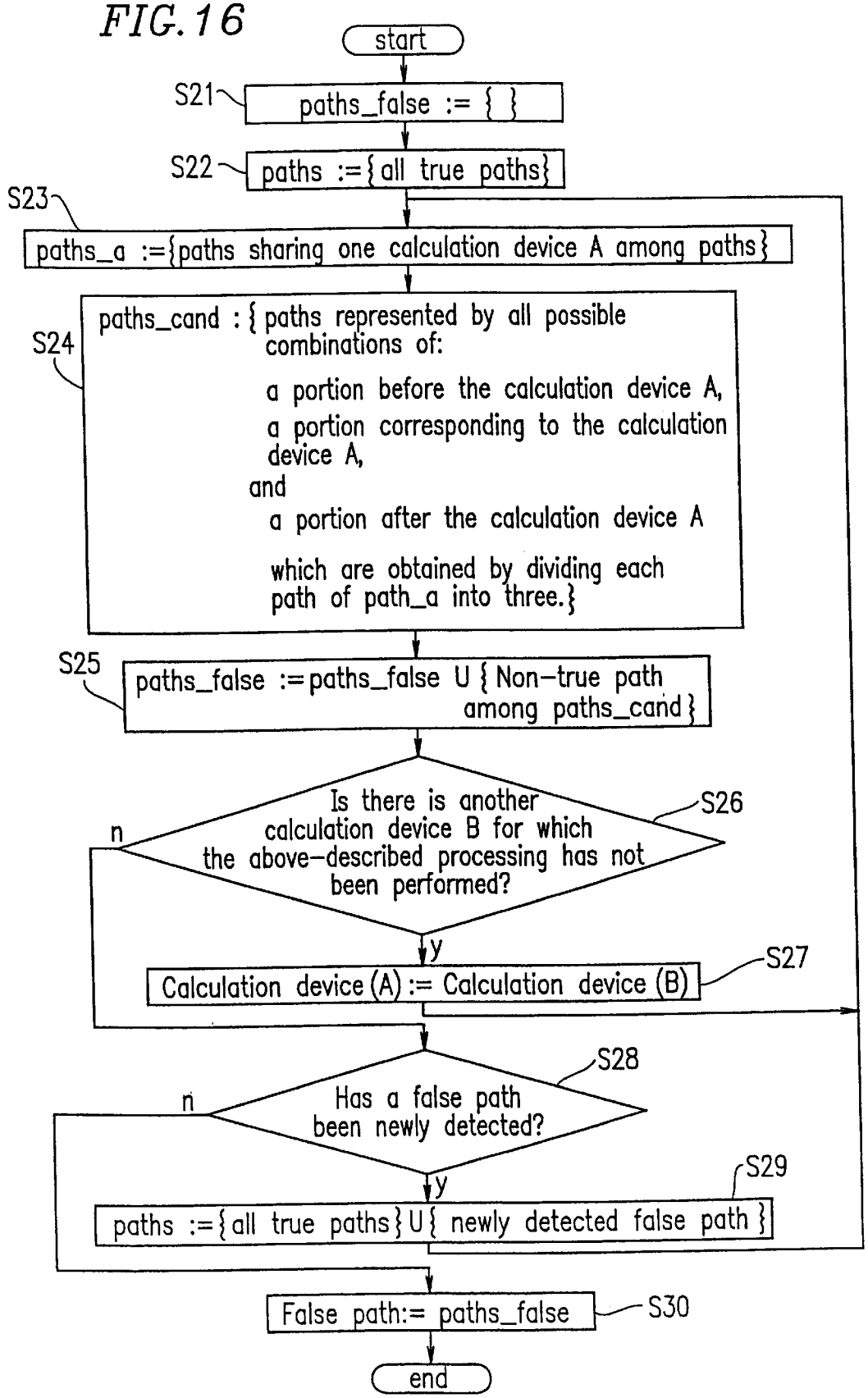

FIG.17

```
reg 1 → mult 1 → adder 1 → reg 1         (step 1)
reg 2 → mult 1 → adder 1 → reg 1         (step 1)
c → adder 1 → reg 1                       (step 1)
reg 1 → adder 1 → div 1 → reg 1          (step 2)
reg 2 → adder 1 → div 1 → reg 1          (step 2)
```

FIG.18

```
reg 1 → mult 1 → |adder 1| → reg 1              (step 1)
reg 2 → mult 1 → |adder 1| → reg 1              (step 1)
            c → |adder 1| → reg 1               (step 1)
        reg 1 → |adder 1| → div 1 → reg 1       (step 2)
        reg 2 → |adder 1| → div 1 → reg 1       (step 2)
```

FIG.19

```
reg 1 → mult 1 → adder 1 → reg 1
reg 1 → mult 1 → adder 1 → div 1 → reg 1
reg 2 → mult 1 → adder 1 → reg 1
reg 2 → mult 1 → adder 1 → div 1 → reg 1
            c → adder 1 → reg 1
            c → adder 1 → div 1 → reg 1
        reg 1 → adder 1 → reg 1
        reg 1 → adder 1 → div 1 → reg 1
        reg 2 → adder 1 → reg 1
        reg 2 → adder 1 → div 1 → reg 1
```

CIRCUIT SYNTHESIS METHOD

BACKGROUND OF THE INVENTION

1. Field of the Invention

The present invention relates to a circuit synthesis method for an LSI for automatically generating a logic circuit of a register transfer level (RTL) from a behavioral description, and specifically to a high level synthesis method which is especially effective for designing devices which need to be designed within a short period of time such as, for example, ASICs (Application Specific Integrated Circuits).

2. Description of the Related Art

High level synthesis is a technology for automatically generating an RTL logic circuit from a behavioral description which describes only a behavior of calculation processing and does not include information on a hardware structure. High level synthesis is described in detail in Deniel Gajski, Allen Wu, Nikil Dutt and Steve Lin, "High-Level Synthesis" published by Kluwer Academic Publishers, 1992. High level synthesis is also disclosed in Japanese Laid-Open Publication No. 5-101141. High level synthesis will be described briefly below.

<Conversion of Behavioral Description into CDFG>

In high level synthesis, a behavioral description describing only a behavior of calculation processing is analyzed, and then the behavioral description is converted into a model referred to as a control data flowgraph (CDFG) representing the dependency among the calculations, i.e., the execution order of the calculations.

For example, a behavioral description of expression (1) is converted into a CDFG in the following manner.

$$f=\{(a*b)+c+d)\}/e \quad (1)$$

A CDFG is a graph in which calculations, inputs and outputs are represented by nodes, and data dependency (i.e., execution order of calculations, inputs and outputs) is represented by directional edges (data dependency edges; e.g., arrows). For example, in FIG. 1, which illustrates a CDFG 100 corresponding to the behavioral description of expression (1), a data dependency edge 15 indicates that an addition 5 is performed after a multiplication 4 is performed. In the CDFG 100, inputs "a", "b", "c", "d" and "e" are respectively represented by reference numerals 28 through 32, and an output "f" is represented by reference numeral 33. As mentioned above, the multiplication ("*") is represented by reference numeral 4, and additions ("+") are represented by reference numerals 5 and 6. A division ("/") is represented by reference numeral 7. In this specification, symbol "*" indicates multiplication.

A data dependency edge from the input "a" 28 to the multiplication 4 is represented by reference numeral 13. A data dependency edge from the input "b" 29 to the amultiplication 4 is represented by reference numeral 14. A data dependency edge from the multiplication 4 to the addition 5 is represented by reference numeral 15. A data dependency edge from the input "c" 30 to the addition 5 is represented by reference numeral 16. A data dependency edge from the addition 5 to the addition 6 is represented by reference numeral 17. A data dependency edge from the input "d" 31 to the addition 6 is represented by reference numeral 18. A data dependency edge from the addition 6 to the division 7 is represented by reference numeral 19. A data dependency edge from the input "e" 32 to the division 7 is represented by reference numeral 20. A data dependency edge from the division 7 to the output "f" 33 is represented by reference numeral 21.

<Scheduling>

After the behavioral description of expression (1) is converted into the CDFG 100 (FIG. 1), scheduling is performed. Scheduling is processing for assigning each of the calculations, inputs and the output to a time slot. (The CDFG 100 (FIG. 1) includes only one output.) Each time slot corresponds to a state of a finite state machine and is referred to as a scheduling step.

FIG. 2 shows a scheduling result 110 obtained as a result of scheduling the CDFG 100 (FIG. 1). Here, a delay time period determined by the multiplication 4 is 50 ns, a delay time period determined by each of the additions 5 and 6 is 10 ns, a delay time period determined by the division 7 is 60 ns, and a clock cycle in each scheduling step is 100 ns.

Scheduling is performed so that the total of the delay time periods of the calculations, which are connected by data dependency edges and scheduled in one scheduling step, does not exceed one clock cycle. For example, in FIG. 2, the total of the delay time periods determined by the multiplication 4, the additions 5 and 6, and the division 7 is 50+10+10+60=130 ns. Accordingly, these four calculations cannot be scheduled in one scheduling step.

In FIG. 2, the input "a" 28 and the input "b" 29 are scheduled in scheduling step 0. The multiplication 4, the input "c" 30, the addition 5 and the input "d" 31 are scheduled in scheduling step 1. The addition 6, the input "e" 32 and the division 7 are scheduled in scheduling step 2. Only the output "f" 33 is scheduled in scheduling step 3.

The same type of calculations scheduled in different scheduling steps can share one calculation device. In FIG. 2, the addition 5 and the addition 6 are respectively scheduled in scheduling steps 1 and 2, and therefore can share one calculation device. By scheduling, each of the calculations is assigned to an appropriate scheduling step so as to minimize the cost of the hardware.

In the scheduling result 110 shown in FIG. 2, the data dependency edges 13 and 14 cross the clock boundary between scheduling steps 0 and 1. The data dependency edges 17 and 18 cross the clock boundary between scheduling steps 1 and 2. The data dependency edge 21 crosses the clock boundary between scheduling steps 2 and 3.

<Allocation>

Allocation is processing for allocating calculation devices, registers, and input and output pins required to execute the scheduled CDFG; and assigning the calculations of the CDFG to the calculation devices, assigning the data dependency edges crossing the clock boundaries between two adjacent scheduling steps to the registers, and assigning the inputs and outputs to the input and output pins. (Only one output is necessary for the CDFG 100 in FIG. 1.)

FIGS. 3, 4 and 5 show allocation procedures 120, 121 and 122 performed on the CDFG 100 (FIG. 1) scheduled as shown in FIG. 2. FIG. 3 shows an allocation procedure 120 for the calculation devices; FIG. 4 shows an allocation procedure 121 for the registers; and FIG. 5 shows an allocation procedure 122 for the inputs and the output.

By the allocation procedure 120 for the calculation devices shown in FIG. 3, one multiplier 8 ("mult 1"), one adder 9 ("adder 1"), and one divider 10 ("div 1") are allocated. The multiplication 4 in the CDFG 100 is assigned to the multiplier 8. The additions 5 and 6 scheduled in different scheduling steps are assigned to the one adder 9. The division 7 is assigned to the divider 10.

By the allocation procedure 121 for the registers shown in FIG. 4, a first register 11 ("reg 1") and a second register 12 ("reg 2") are allocated. One of the data dependency edges crossing the clock boundary between scheduling steps 0 and 1 (data dependency edge 13), one of the data dependency edges crossing the clock boundary between scheduling steps 1 and 2 (data dependency edge 17), and the data dependency edge 21 crossing the clock boundary between scheduling steps 2 and 3 are assigned to the first register 11. The other data dependency edge crossing the clock boundary between scheduling steps 0 and 1 (data dependency edge 14) and the other data dependency edge crossing the clock boundary between scheduling steps 1 and 2 (data dependency edge 18) are assigned to the second register 12.

By the allocation procedure 122 for the inputs and output shown in FIG. 5, five input pins "a" 22, "b" 23, "c" 24, "d" 25, and "e" 26, and one output pin "f" 27 are allocated. The input "a" 28 is assigned to the input pin "a" 22, the input "b" 29 is assigned to the input pin "b" 23, the input "c" 30 is assigned to the input pin "c" 24, the input "d" 31 is assigned to the input pin "d" 25, and the input "e" 32 is assigned to the input pin "e" 26. The output "f" 33 is assigned to the output pin "f" 27.

<Data Path Generation>

Data path generation is processing for generating circuit paths corresponding to the data dependency edges in the CDFG. FIG. 6 shows an exemplary data path generation result 130 obtained as a result of the data path generation performed on the CDFG 100 (FIG. 1).

For the calculation devices, registers or the like which are shared, a multiplexer is allocated for selecting data to be input to the calculation devices, registers or the like. In FIG. 6, a first multiplexer 41 ("mux 1") is allocated for the first register 11, and a second multiplexer 42 ("mux 2") is allocated for the second register 12. A third multiplexer 43 ("mux 3") and a fourth multiplexer 44 ("mux 4") are allocated for the adder 9.

A data path which corresponds to a path from the input "a" 28 through the data dependency edge 13 to the multiplication 4 is generated by first generating a path from the input pin "a" 22 through the first multiplexer 41 to the first register 11 and then generating a path from the first register 11 to the multiplier 8. Other data paths are generated in a similar manner.

<Controller Generation>

Controller generation is processing for generating a controller for controlling the calculation devices, registers and multiplexers allocated by the allocation and the data path generation.

FIG. 7 shows an exemplary controller generation result 140 obtained as a result of generating a controller 50. The controller 50 controls the first and second multiplexers 41 and 42, the first and second registers 11 and 12, and third and fourth multiplexers 43 and 44.

As described above, in high level synthesis, a plurality of calculations connected by data dependency edges can be scheduled in one scheduling step and can share one calculation device. In such high level synthesis, data paths generated by the data path generation include true paths. However, the data paths may undesirably include a false path. A true path is a data path which becomes entirely active in either one of scheduling steps; and a false path is a data path which does not become entirely active in either one of scheduling steps. The false path is formed by a combination of portions of true paths.

FIG. 8 shows an exemplary data path generation result 150 obtained for the CDFG 100 (FIG. 1). In the data path generation result 150, a data path 47 from the first register 11—the multiplier 8—the third multiplexer 43—the adder 9—the divider 10—the first multiplexer 41 to the first register 11 is generated as a false path. The false path 47 causes a delay time period of 120 ns. The false path 47 is formed by combining a portion of each of the following two true paths. One true path is: the first register 11—the multiplier 8—the third multiplexer 43—the adder 9—the first multiplexer 41—the first register 11. The other true path is: the first register 11—the third multiplexer 43—the adder 9—the divider 10—the first multiplexer 41—the first register 11. A portion from the first true path: the first register 11—the multiplier 8—the third multiplexer 43—the adder 9 is combined with a portion from the second true path: the adder 9—the divider 10—the first multiplexer 41—the first register 11. Thus, the false path 47 is formed.

Even when such a false path is generated and the delay time period determined by the false path exceeds the clock cycle, the logic circuit normally operates. The reason is that the false path does not become entirely active in either one of scheduling steps.

However, a logic synthesis tool cannot usually determine which data path is a true path and which path is a false path. Accordingly, in logic synthesis, the delay time period of a false path which does not need to be optimized is optimized like a true path so that the delay time period does not exceed the clock cycle. This results in enlargement of the size of the logic circuit. In addition, when the delay time period of a path exceeds the clock cycle as a result of logic synthesis, the logic synthesis tool incorrectly determines that the condition for the delay time period is not fulfilled even when that path is a false path, and operates abnormally.

SUMMARY OF THE INVENTION

According to one aspect of the invention, a circuit synthesis method, comprising the steps of converting a behavioral description describing a behavior of calculation processing into a control data flowgraph; assigning at least one calculation, at least one input and at least one output in the control data flowgraph into prescribed time slots: assigning the at least one calculation, a plurality of data dependency edges, the at least one input and the at least one output respectively to at least one calculation device, at least one register, at least one input pin and at least one output pin; generating a plurality of paths corresponding to the plurality of data dependency edges; and detecting a first false path among the plurality of paths.

In one embodiment of the invention, the step of detecting the first false path among the plurality of paths includes the step of detecting, among at least one first path formed by combining at least a portion of at least one true path generated by the plurality of paths, a second path, which is not a true path, as the first false path.

In one embodiment of the invention, the step of detecting the first false path among the plurality of paths includes the steps of detecting at least one third path including one of the at least one calculation device, among the at least one true path; dividing the at least one third path into a plurality of portions: detecting at least one fourth path formed by combining the plurality of portions of the at least one third path; and detecting, among the at least one fourth path, a fifth path, which is not a true path, as the first false path.

In one embodiment of the invention, the circuit synthesis method further includes the steps of detecting at least one sixth path including the one of the at least one calculation device, among the at least one true path and the first false path; dividing the at least one sixth path into a plurality of portions; detecting at least one seventh path formed by combining the plurality of portions of the at least one sixth path; and detecting, among the at least one seventh path, an eighth path, which is not a true path, as a second false path.

In one embodiment of the invention, the circuit synthesis method further includes the step of estimating a delay time period occurring in logic synthesis, ignoring the first false path.

In one embodiment of the invention, the circuit synthesis method further includes the step of estimating a delay time period occurring in logic synthesis, ignoring information on the second false path.

According to another aspect of the invention, a recording medium having a program written thereon for causing a computer to execute circuit synthesis is provided. The circuit synthesis is performed by a method including the steps of converting a behavioral description describing a behavior of calculation processing into a control data flowgraph; assigning each of at least one calculation, at least one input and at least one output in the control data flowgraph into a prescribed time slot; assigning the at least one calculation, a plurality of data dependency edges, the at least one input and the at least one output respectively to at least one calculation device, at least one register, at least one input pin and at least one output pin; generating a plurality of paths corresponding to the plurality of data dependency edges; and detecting a first false path among the plurality of paths.

Thus, the invention described herein makes possible the advantages of providing a circuit synthesis method for preventing a logic synthesis tool from optimizing the delay time period of a false path and preventing the logic synthesis tool from operating abnormally by determining that the condition for the delay time period is not fulfilled when a delay time period determined by the false path exceeds a clock cycle.

These and other advantages of the present invention will become apparent to those skilled in the art upon reading and understanding the following detailed description with reference to the accompanying figures.

BRIEF DESCRIPTION OF THE DRAWINGS

FIGS. 11 and 12 illustrate, in detail, data path generation performed for the CDFG shown in FIG. 1 by the high level synthesis method according to the present invention;

FIG. 13 shows exemplary true path information, indicating the contents of true paths which become active in scheduling steps, obtained by the high level synthesis method according to the present invention;

FIG. 16 is a flowchart illustrating the processing in step S6 in FIG. 9 according to the present invention; and FIGS. 17 through 20 show exemplary data path information, illustrating how a false path is detected from the data path information shown in FIG. 13 by the high level synthesis method according to the present invention.

DESCRIPTION OF THE PREFERRED EMBODIMENTS

Hereinafter, the present invention will be described by way of illustrative examples with reference to the accompanying drawings.

Figure 9:
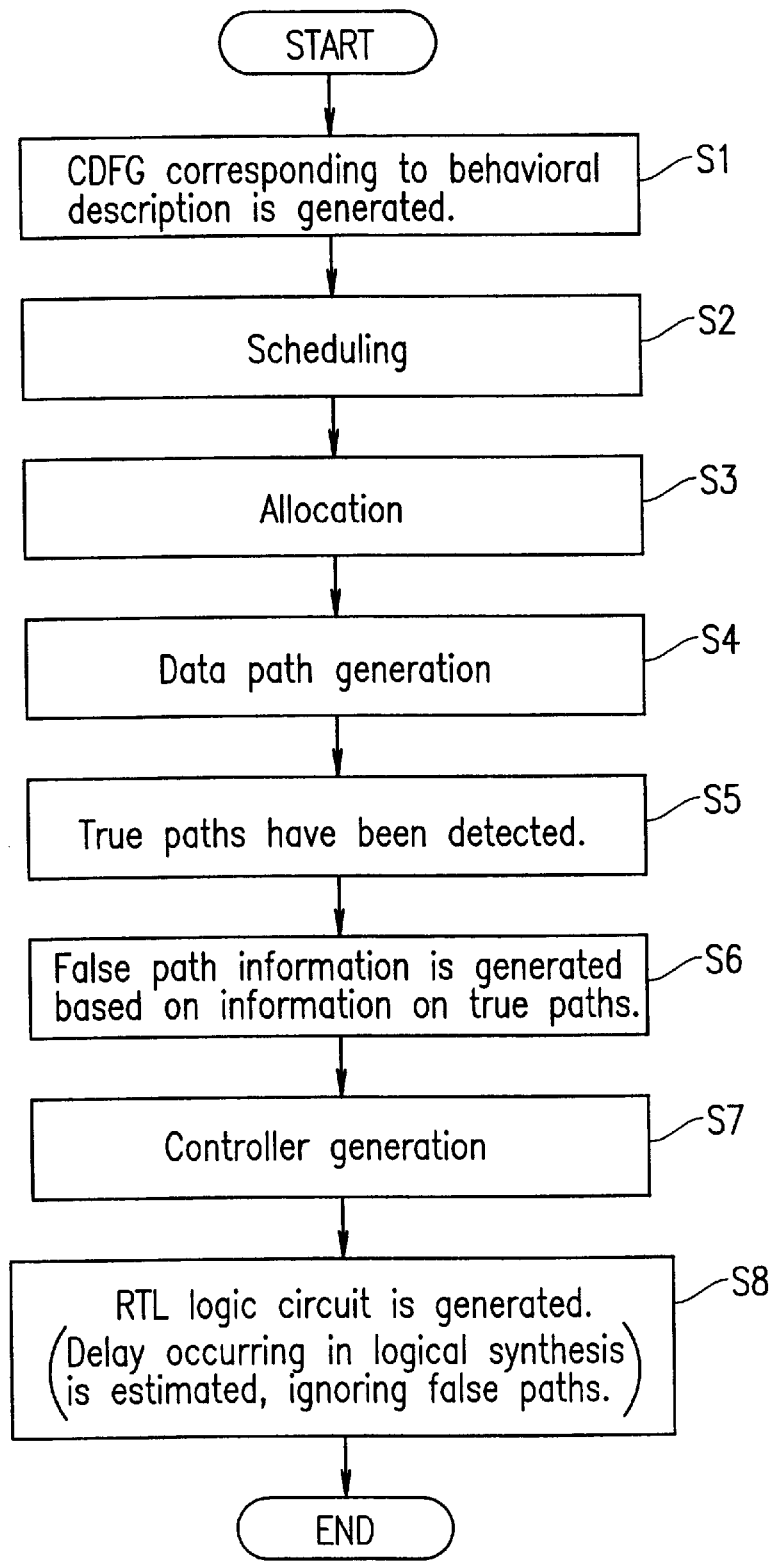
FIG. 9 is a flowchart illustrating an exemplary high level synthesis method according to the present invention.

FIG. 9 is a flowchart illustrating an exemplary high level synthesis method in an example according to the present invention. The high level synthesis method will be described with reference to FIG. 9.

Figure 2:
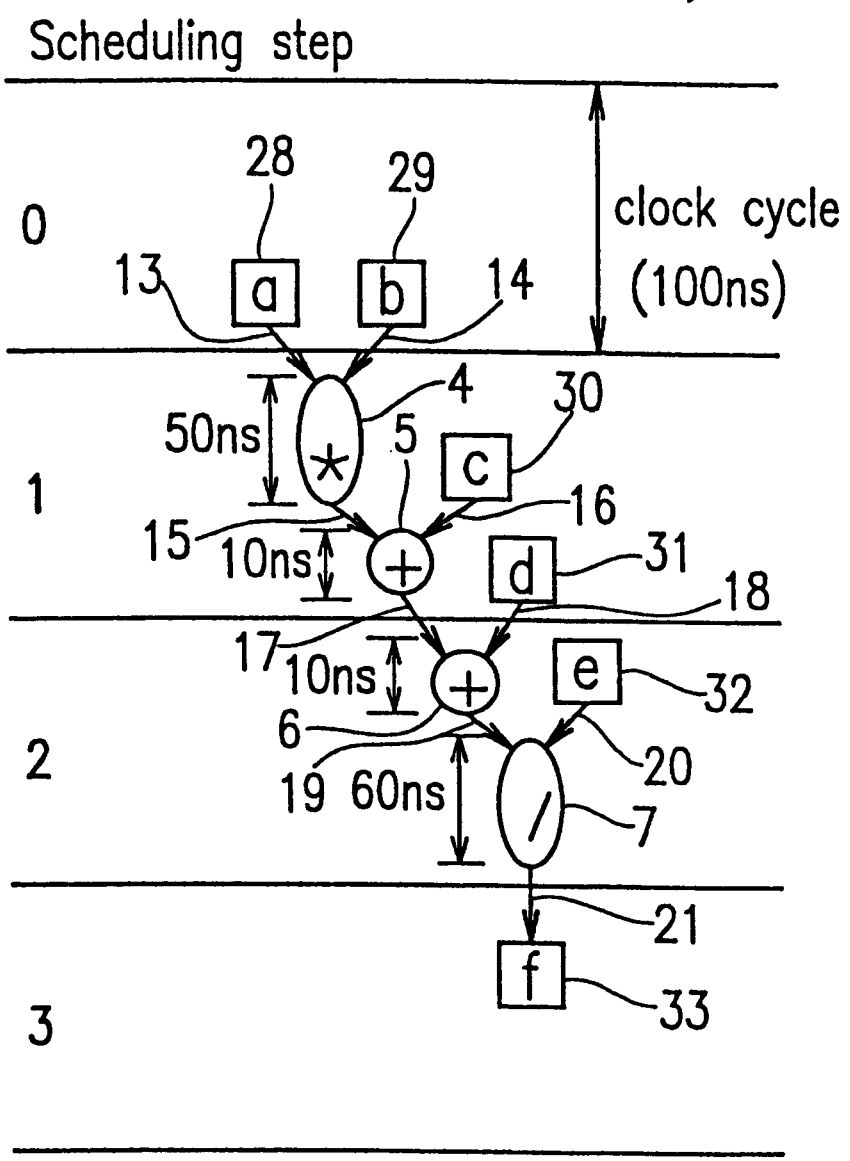
FIG. 2 shows an exemplary scheduling result obtained as a result of scheduling the CDFG shown in FIG. 1.
Figure 3:
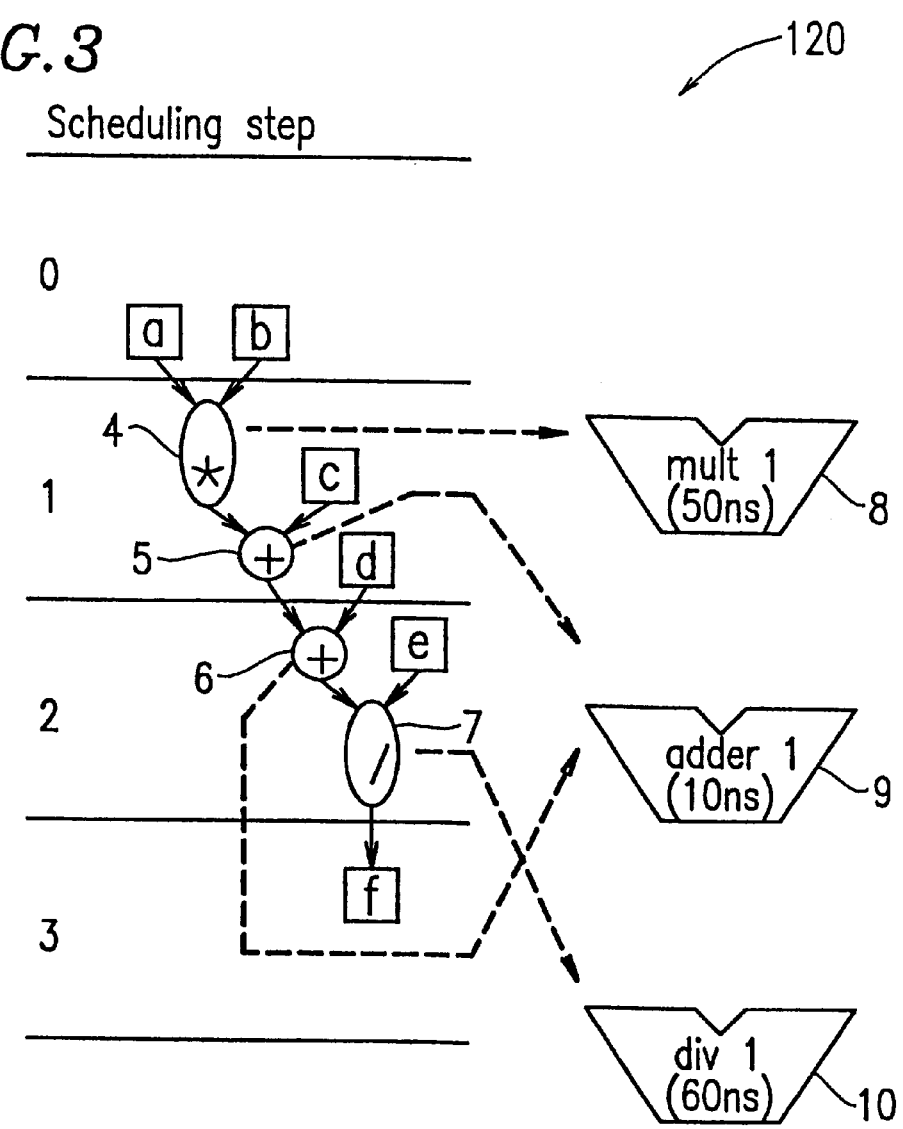
FIGS. 3 through 5 show exemplary allocation results obtained as a result of performing allocation on the CDFG shown in FIG. 1.
Figure 4:
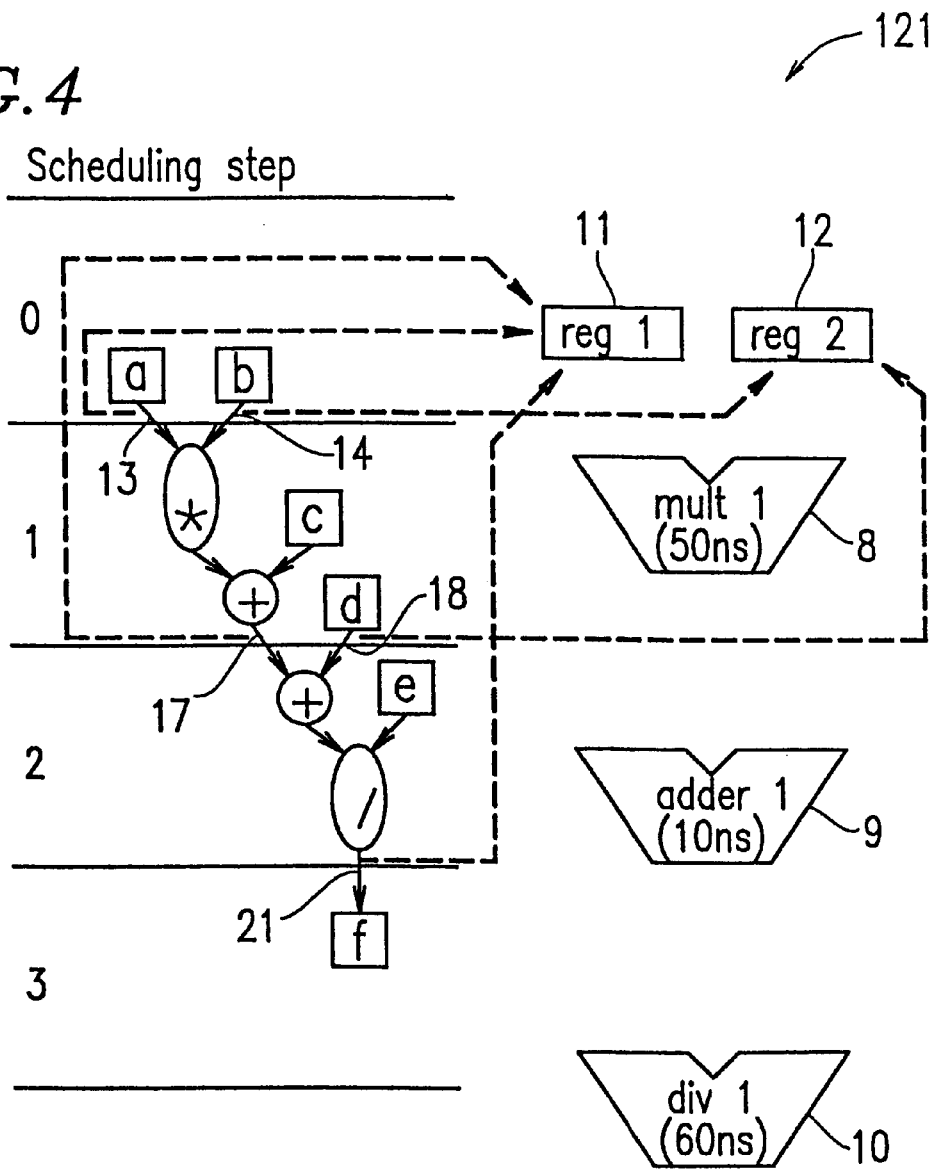
Figure 5:
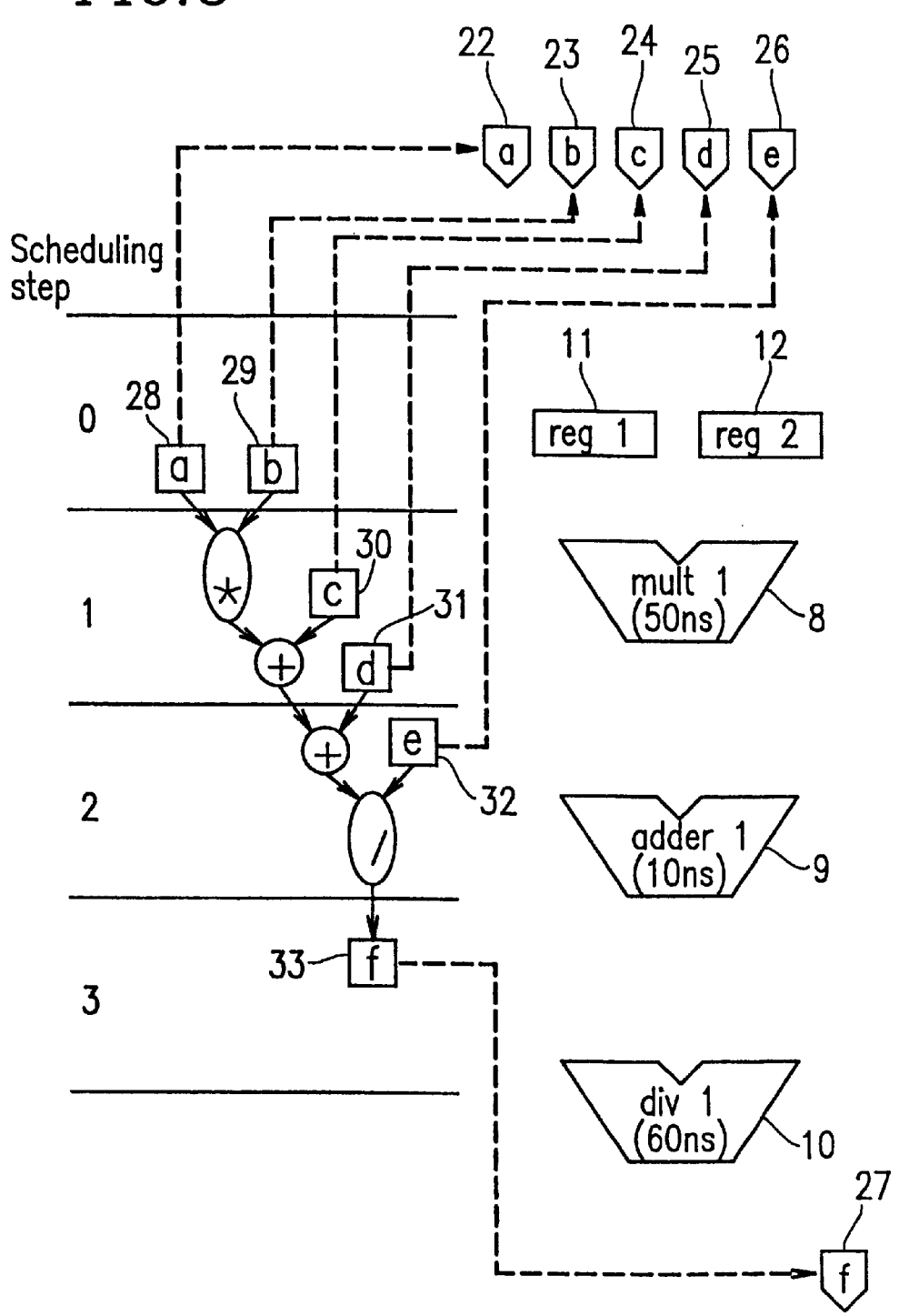

First, in step S1, a behavioral description of expression (1) set forth above is input to a logic synthesis tool, thereby generating a CDFG corresponding to the behavioral description. Then, in step S2, the CDFG is scheduled as described above with reference to FIG. 2. In step S3, allocation is performed for the scheduled CDFG as described above with reference to FIGS. 3, 4 and 5. Then, in step S4, data path generation is performed.

Figure 10:
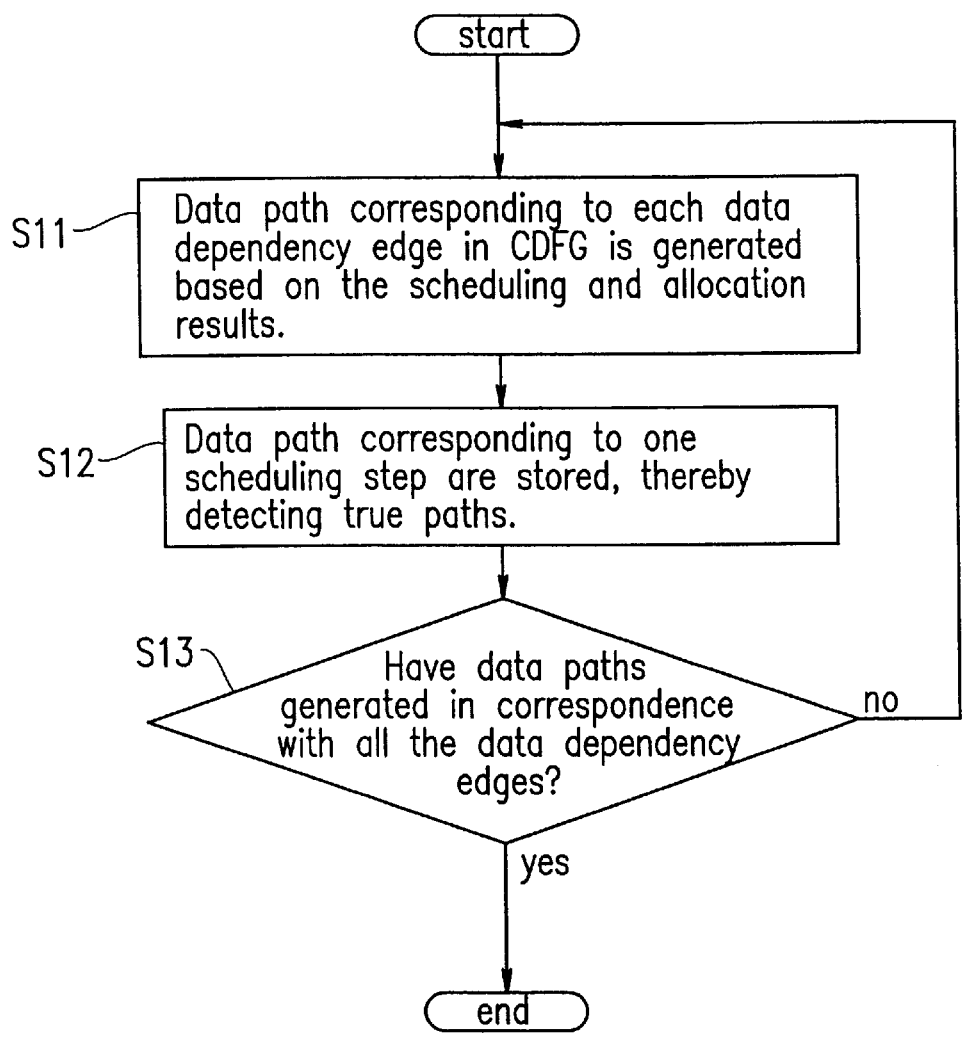
FIG. 10 is a flowchart illustrating the processing of step S4 in FIG. 9 according to the present invention.

FIG. 10 is a flowchart illustrating the data path generation in detail. In step 11, based on the scheduling and allocation results shown in FIGS. 2 through 5, a data path corresponding to a data dependency edge of the CDFG is generated. In step S12, each time data paths corresponding to one scheduling step are generated, these data paths are stored, thereby detecting true paths. Steps S11 and S12 are repeated until data paths are generated in correspondence to all the data dependency edges. When it is determined, in step S13, that data paths are generated in correspondence to all the data dependency edges, the procedure goes to step S5 in FIG. 9. At this point, all the true path have been detected.

In step S6, the paths which are not true paths among the data paths are detected as false paths, and false path information is generated.

Figure 7:
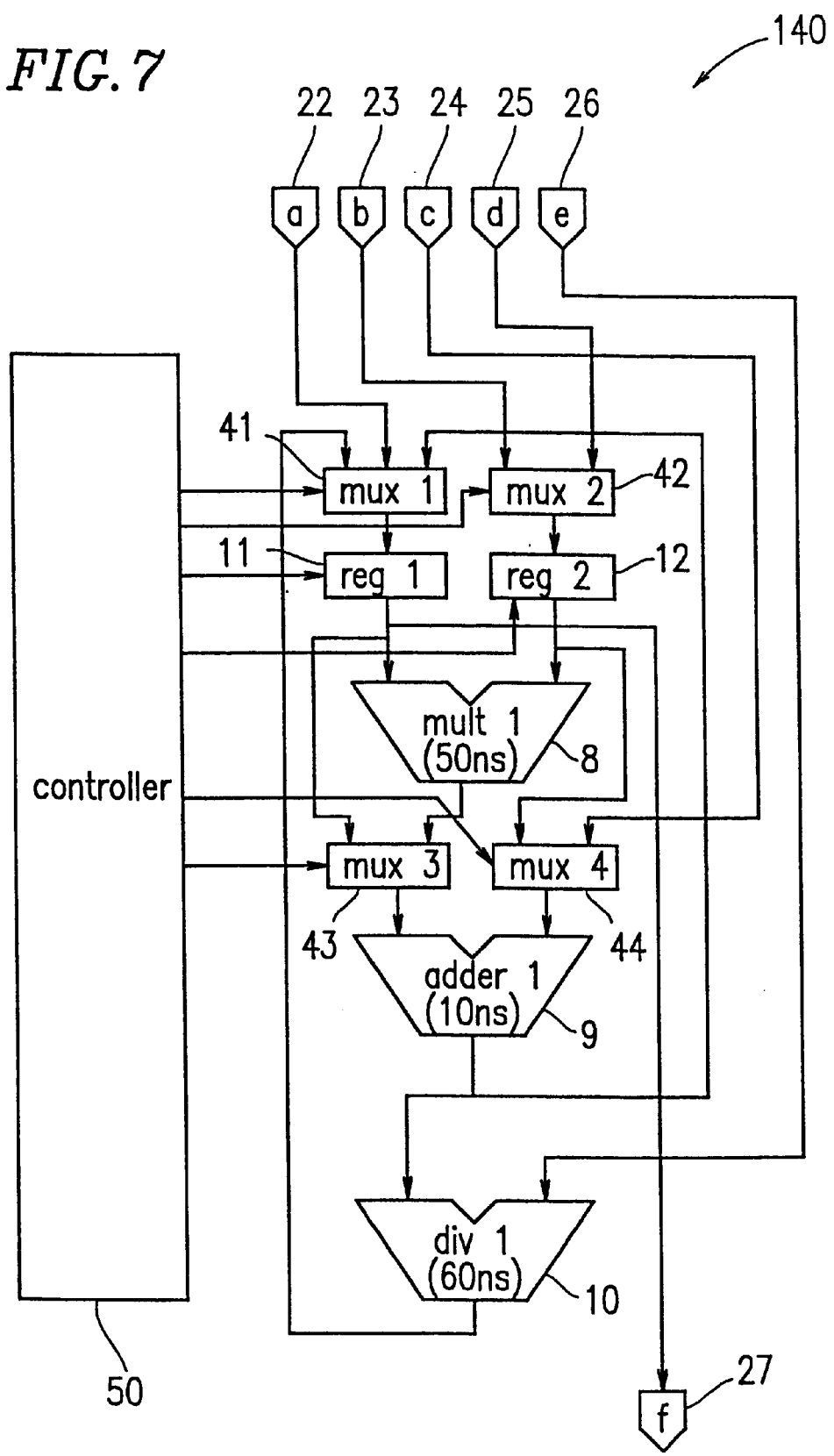
FIG. 7 shows an exemplary controller generation result obtained as a result of generating a controller for the CDFG shown in FIG. 1.
Figure 8:
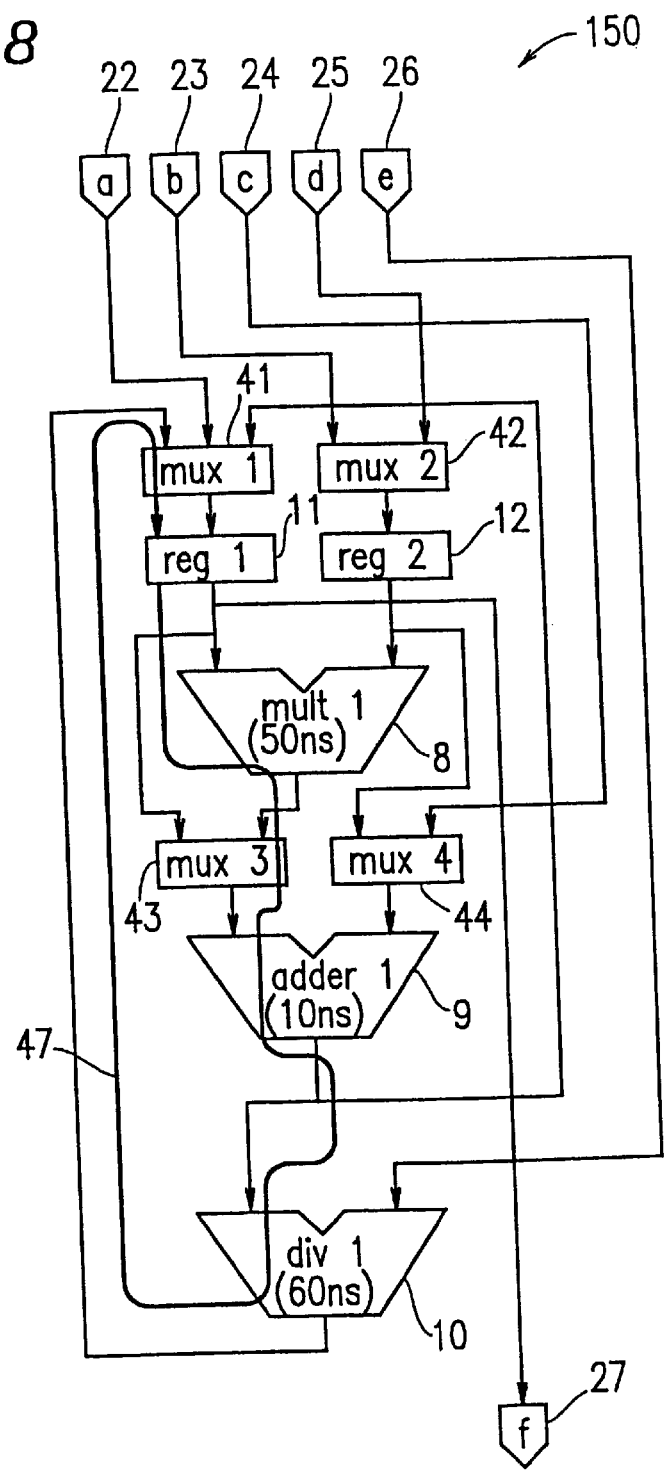
FIG. 8 shows an exemplary data path generation result obtained as result of data path generation performed on the CDFG shown in FIG. 1.

In step S7, controller generation is performed as described above with reference to FIG. 7. In step S8, the total delay time period is estimated, ignoring the false paths. Thus, the RTL logic circuit is generated.

Figure 1:
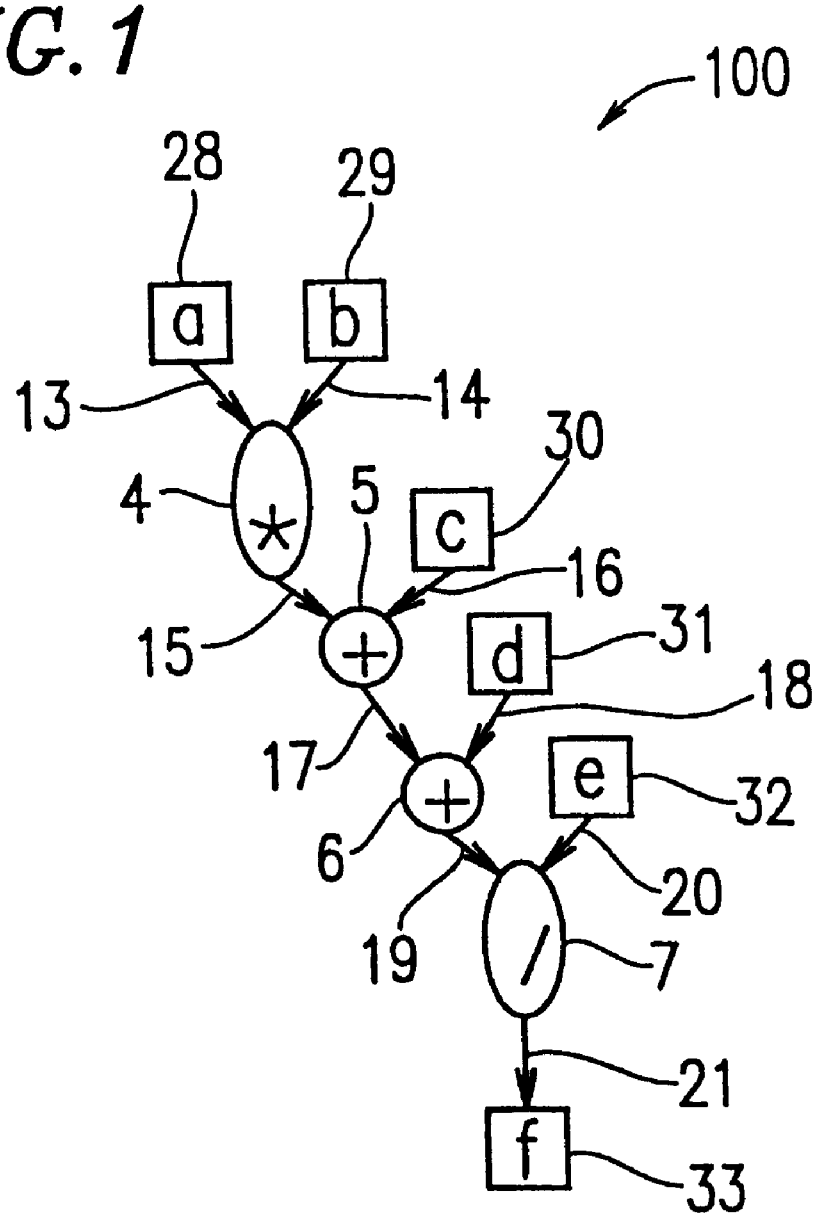
FIG. 1 shows an exemplary CDFG in a high level synthesis method.
Figure 11:
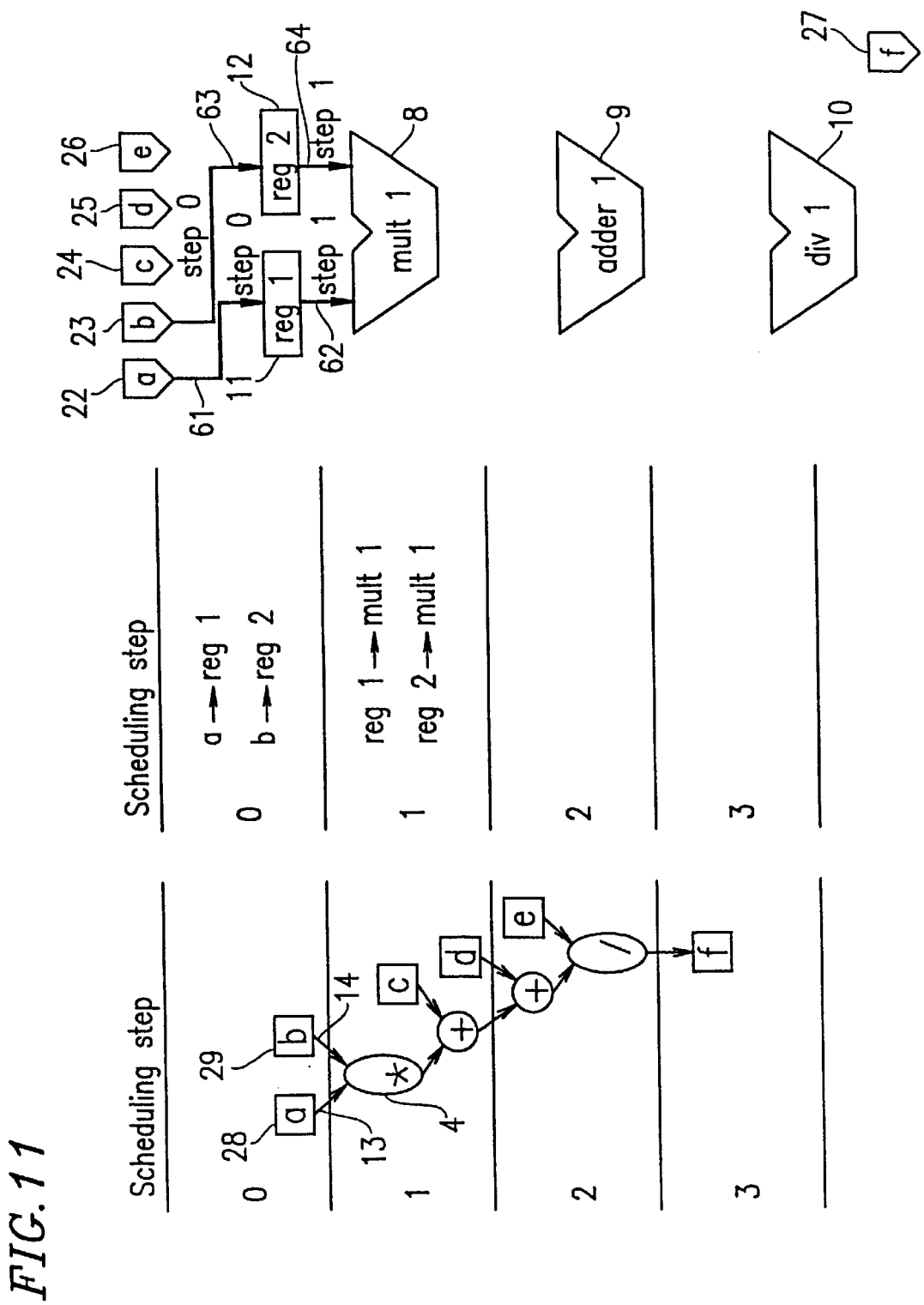

With reference to FIGS. 11 and 12, the data path generation performed for the CDFG 100 (FIG. 1) will be described. The scheduling and allocation are performed as described with reference to FIGS. 2 through 5.

As shown in FIG. 11, the data dependency edge 13 from the input "a" 28 to the multiplication 4 corresponds to a data path from the input pin "a" 22 to the multiplier 8. This data path is stored as a data path 61, which is from the input pin "a" 22 to the first register 11 and which becomes active in scheduling step 0, and a data path 62, which is from the first register 11 to the multiplier 8 and which becomes active in scheduling step 1. The data paths 61 and 62 are both true paths.

The data dependency edge 14 from the input "b" 29 to the multiplication 4 corresponds to a data path from the input pin "b" 23 to the multiplier 8. This data path is stored as a data path 63, which is from the input pin "b" 23 to the second register 12 and which becomes active in scheduling step 0, and a data path 64, which is from the second register 12 to the multiplier 8 and which becomes active in scheduling step 1. The data paths 63 and 64 are both true paths.

In a similar manner, as shown in FIG. 12, the data path corresponding to the data dependency edge 15 from the multiplication 4 to the addition 5 is stored as a data path 65 from the multiplier 8 to the adder 9. The data path 65 becomes active in scheduling step 1 and thus is a true path. Since the data path 62 from the first register 11 to the multiplier 8 and the data path 64 from the second register 12 to the multiplier 8 have already been stored as true paths which become active in scheduling step 1, the data path 65 is stored as an additional path to the paths 62 and 64. Accordingly, storage of the data path 65 means storage of a data path from the first register 11 through the multiplier 8 to the adder 9 and a data path from the second register 12 through the multiplier 8 to the adder 9.

Data paths are stored in this manner for each scheduling step.

FIG. 13 shows exemplary true path information 212, indicating the contents of true paths which become active in scheduling steps 0 through 3. FIGS. 14A through 14D respectively show true path configurations 220, 221, 222 and 223 corresponding to FIG. 13.

Figure 6:
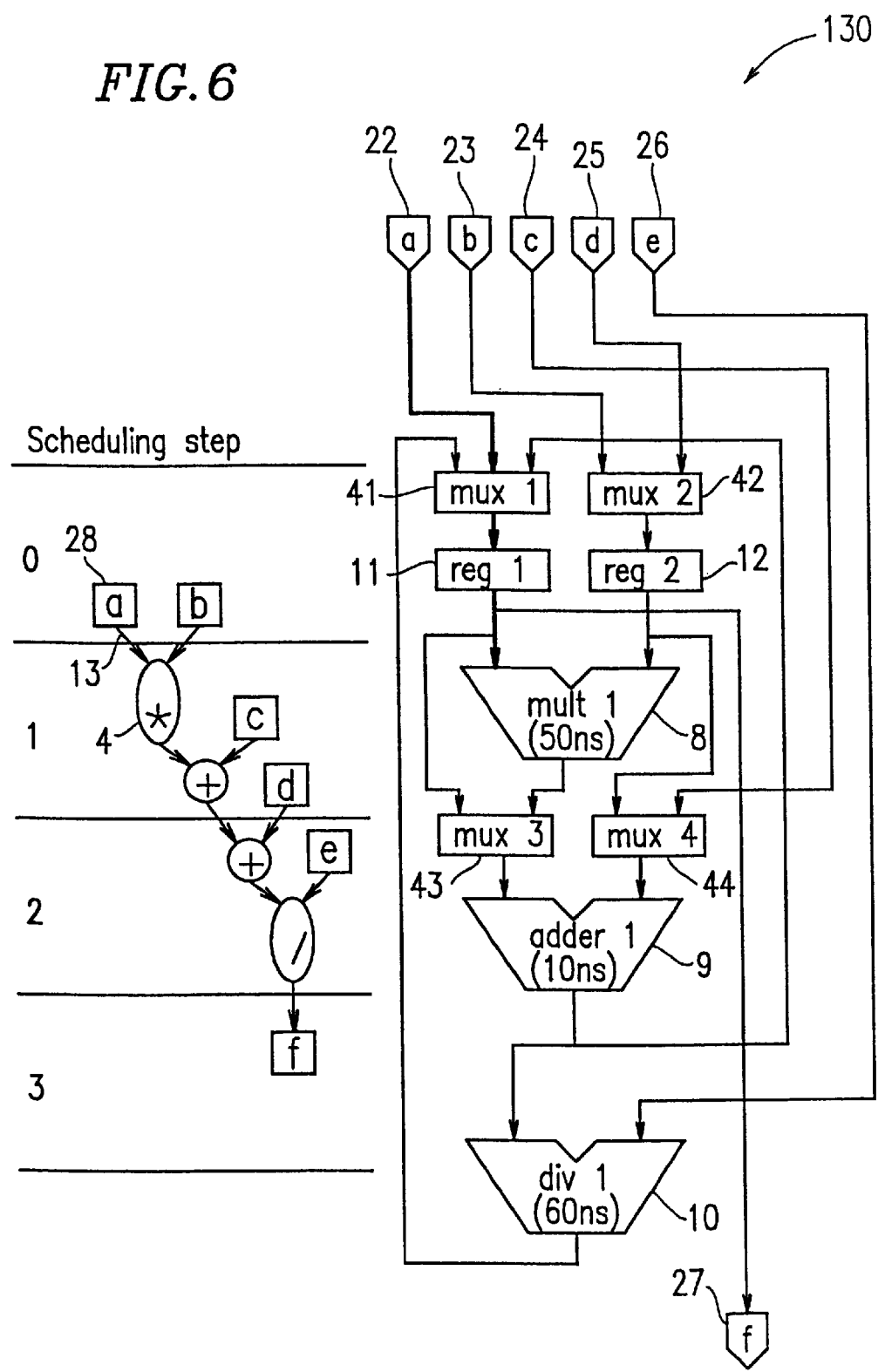
FIG. 6 shows an exemplary data path generation result obtained as result of data path generation performed on the CDFG shown in FIG. 1.
Figure 14A:
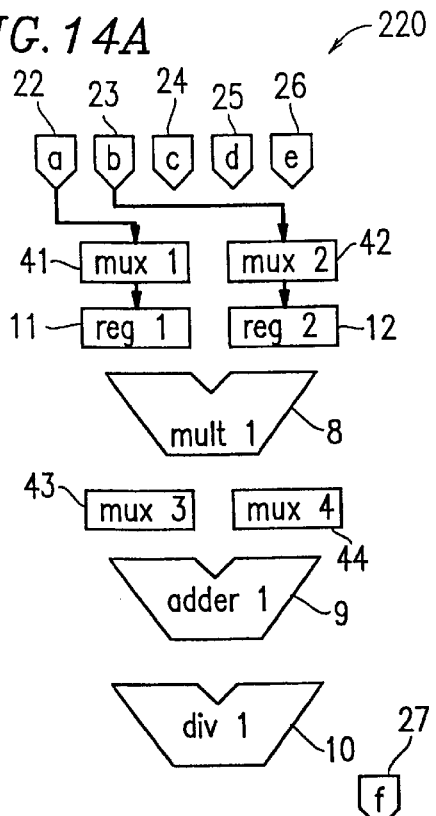
FIGS. 14A through 14D respectively show true path configurations corresponding to the true path information shown in FIG. 13 obtained by the high level synthesis method according to the present invention.
Figure 14B:
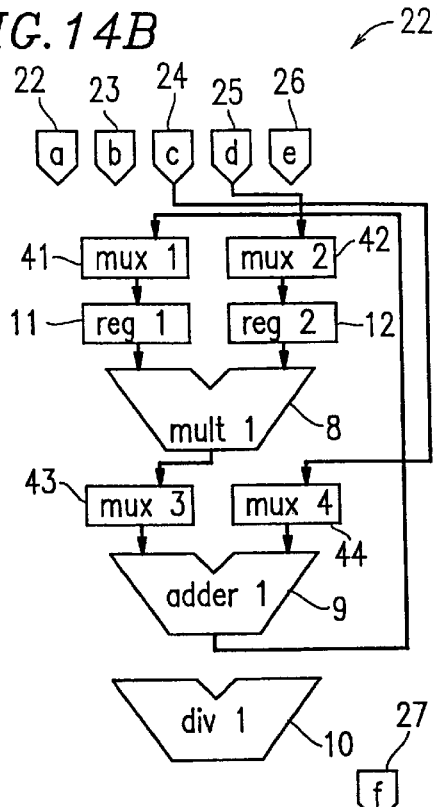

With reference to FIGS. 13 and 14B, and also FIG. 6, the following data paths are stored as true paths becoming active in scheduling step 1: the data path from the first register 11 through the multiplier 8 to the adder 9 and the data path from the second register 12 through the multiplier 8 to the adder 9 (both described above with reference to FIG. 12), a data path from the input pin "c" 24 to the adder 9 to the first register 11, and a data path from the input pin "d" 25 to the second register 12.

Figure 14C:
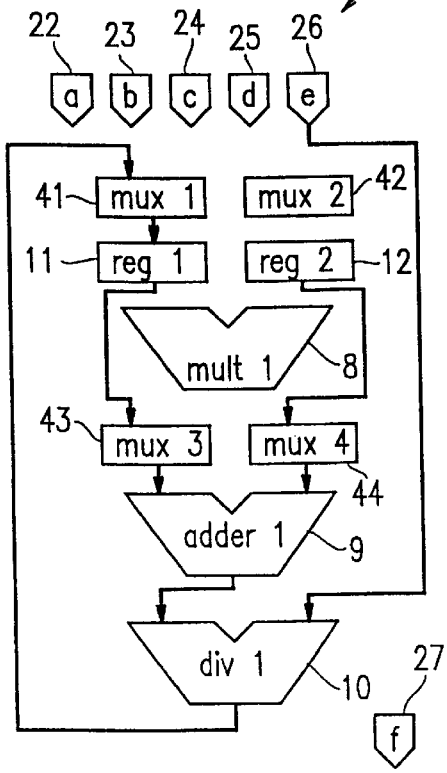

With reference to FIGS. 13, 14C and 6, the following data paths are stored as true paths becoming active in scheduling step 2: a data path from the first register 11 to the adder 9 to the divider 10 to the first register 11, a data path from the second register 12 to the adder 9 to the divider 10 to the first register 11, and a data path from the input pin "e" 26 to the divider 10 to the first register 11.

Figure 14D:
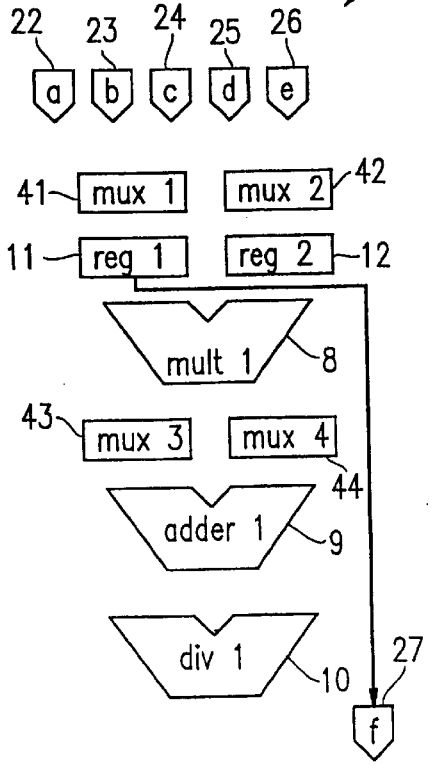

With reference to FIGS. 13, 14D and 6, a data path from the first register 11 to the output pin "f" 27 is stored as a true path becoming active in scheduling step 3.

By storing information on data paths for each scheduling step, all the true paths which become active in any of the scheduling steps can be detected.

A false path is generated of (i) a combination of portions of two true paths divided into two; (ii) a combination of a portion of one true path divided into two and a portion of one false path divided into two; or (iii) a combination of portions of two false paths divided into two.

Figures 15A, 15B, 15C:
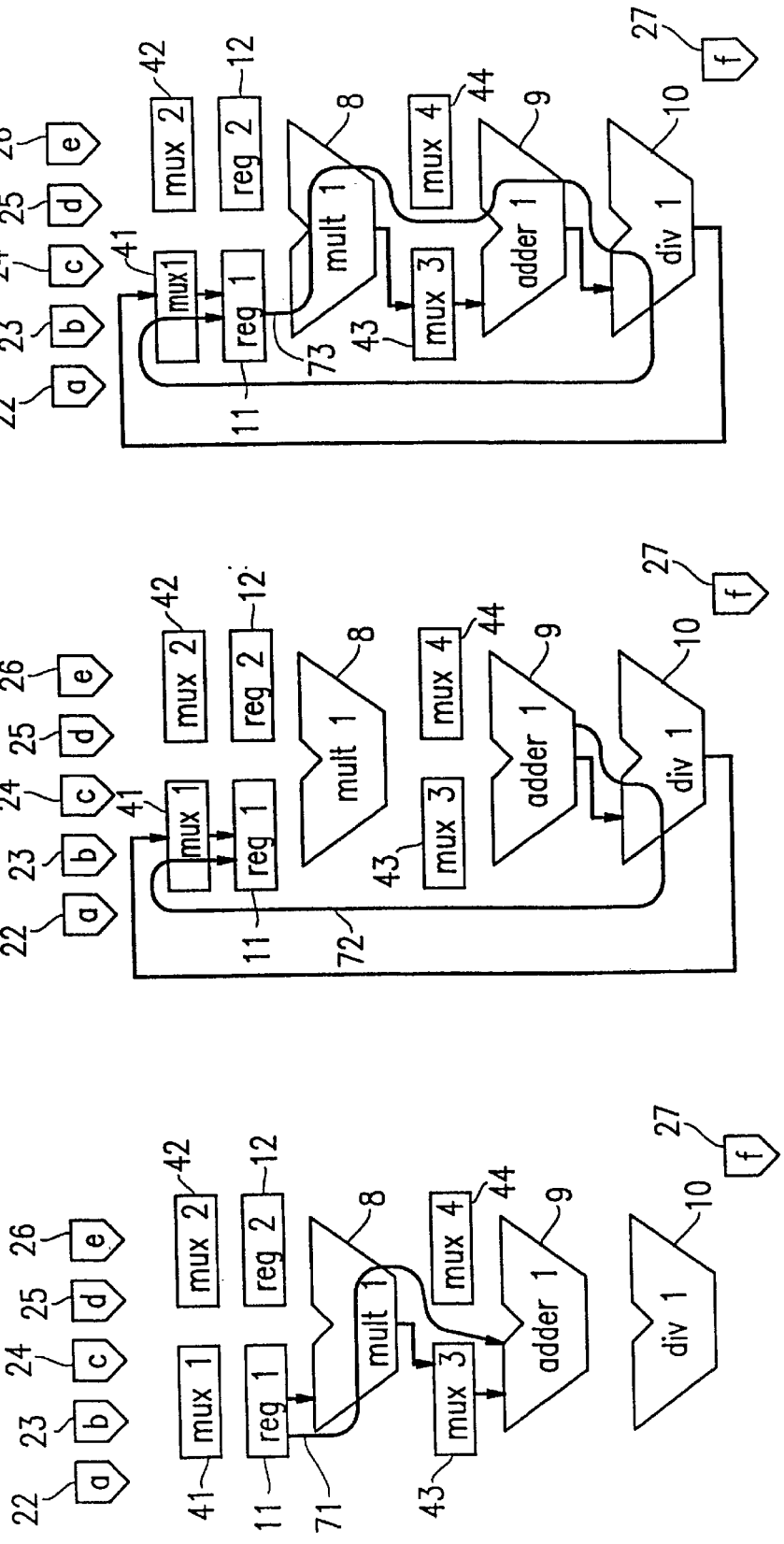
FIGS. 15A through 15C show how a false path is formed.

For example, as shown in FIG. 15A, a data path 71 from the first register 11 through the multiplier 8 to the adder 9 is obtained by dividing a true path, which is from the first register 11 to the multiplier 8 to the adder 9 to the first register 11 and which becomes active in step 1. As shown in FIG. 15B, a data path 72 from the adder 9 to the divider 10 to the first register 11 is obtained by dividing a true path, which is from the first register 11 to the adder 9 to the divider 10 to the first register 11 and which becomes active in step 2. As shown in FIG. 15C, by combining the data paths 71 and 72, a false path 73 from the first register 11 to the multiplier 8 to the adder 9 to the divider 10 to the first register 11 is generated.

FIG. 16 is a flowchart illustrating the processing in step S6 (FIG. 9) of detecting a false path. A method for detecting a false path will be described with reference to FIG. 16.

First, in step S21, a variable "paths_false" indicating a false path which has been detected and stored is cleared. Instep S22, all the true paths are associated to a variable "paths".

In step S23, among a plurality of paths associated to the variable "paths", paths sharing one calculation device A (for example, multiplier 8, adder 9, or divider 10) are detected. The detected paths are associated to a variable "paths_a".

In step S24, each of the paths associated to the variable "paths_a" is divided into (i) a portion before the calculation device A, (ii) a portion corresponding to the calculation device A, and (iii) a portion after the calculation device A. Paths which are represented by all possible combinations of these parts are associated to a variable "paths_cand".

In step S25, among the paths associated to the variable "paths_cand", paths which are not true paths are detected. The detected paths are associated to the variable "paths_false" as newly detected false paths.

When the above-described processing is completed the calculation device A, the processing advances to step S26. In step S26, it is determined whether or not there is another calculation device B for which the above-described processing has not been performed. If there is such a calculation device B, the processing advances to step S27. In step S27, the processing in steps 23 through 25 is repeated for the calculation device B.

When a false path is newly detected in step S28, the newly detected false path is associated to the variable "paths" together with all the true paths in step S29. Then, the processing is repeated from step S23. Accordingly, the detection of false paths is performed again for the calculation devices, for which the above-described processing has already been performed.

As described above, a false path is generated by (iii) a combination of portions of two false paths divided into two, as well as (i) and (ii) set forth above. Accordingly, by associating the newly detected false path to the variable "paths", a false path including a portion of the false path which has already been detected can also be detected.

When there is no more false path newly detected, the processing advances to step S30. In step S30, the paths associated to the variable "paths_false" at that point are defined as false paths.

FIGS. 17 through 20 show exemplary data path information. With reference to FIGS. 17 through 20, an exemplary method for detecting a false path from the data path information 212 shown in FIG. 13 (steps S23, S24 and S25 in FIG. 16) will be described.

First, as shown in FIG. 17, paths including, for example, the adder 9 are detected from all the true paths (FIG. 13) detected as a result of data path generation.

As shown in FIG. 18, the detected paths are divided into a portion before the adder 9, a portion corresponding to the adder 9, and a portion after the adder 9. As shown in FIG. 19, all the paths which are represented by all the possible combinations of these three portions of the detected paths are detected as false path candidates.

Figure 20:
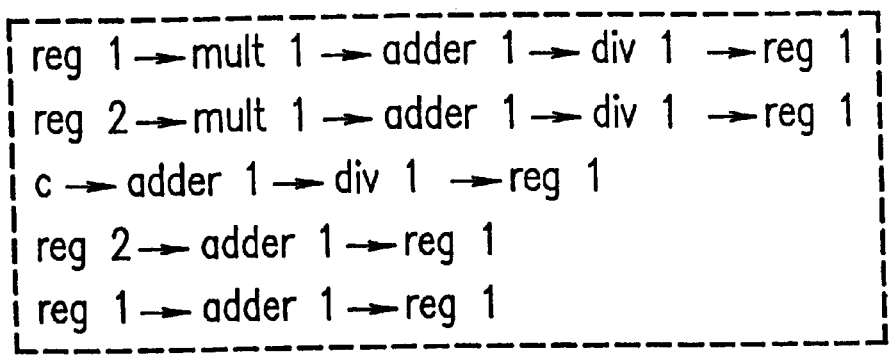

As shown in FIG. 20, among the false path candidates, paths which are not true paths are detected as false paths.

By repeating such processing regarding each of the calculation devices, all the false paths are detected.

A program for executing the above-described circuit synthesis method according to the present invention is recordable on arbitrary recording mediums such as, for example, magnetic disks and optical disks.

The circuit synthesis method according to the present invention is applicable to any behavioral description in addition to the behavioral description mentioned in the above-described example.

According to the present invention, a false path can be detected and false path information is automatically generated from the behavioral description during high level synthesis before logic synthesis. The false path information can be given to the logic synthesis tool. The logic synthesis tool can correctly determine which path is a true path and which path is a false path. The logic synthesis tool ignores the false path when estimating the total delay time period of the calculations to be performed. That is, the logic synthesis tool does not optimize the delay time period for the false path. Accordingly, even when the delay time period exceeds the clock cycle, the circuit can normally operate ignoring the delay which is caused by the false path. As a result, the size of the resultant RTL circuit is prevented from increasing, and the logic synthesis tool is prevented from operating abnormally by incorrectly determining that the condition for delay time period is not fulfilled.

Moreover, according to the present invention, the false paths can be detected efficiently. Therefore, the circuit synthesis can be performed at a high speed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit synthesis method, comprising the steps of:
    converting a behavioral description describing a behavior of calculation processing into a control data flowgraph;
    assigning at least one calculation, at least one input and at least one output in the control data flowgraph into prescribed time slots;
    assigning the at least one calculation, a plurality of data dependency edges, the at least one input and the at least one output respectively to at least one calculation device, at least one register, at least one input pin and at least one output pin;
    generating a plurality of paths corresponding to the plurality of data dependency edges; and
    detecting a first false path among the plurality of paths.

2. A circuit synthesis method according to claim 1, wherein the step of detecting the first false path among the plurality of paths includes the step of detecting, among at least one first path formed by combining at least a portion of at least one true path generated by the plurality of paths, a second path, which is not a true path, as the first false path.

3. A circuit synthesis method according to claim 1, wherein the step of detecting the first false path among the plurality of paths includes the steps of:
    detecting at least one third path including one of the at least one calculation device, among the at least one true path;
    dividing the at least one third path into a plurality of portions;
    detecting at least one fourth path formed by combining the plurality of portions of the at least one third path; and
    detecting, among the at least one fourth path, a fifth path, which is not a true path, as the first false path.

4. A circuit synthesis method according to claim 3, further comprising the steps of:
    detecting at least one sixth path including the one of the at least one calculation device, among the at least one true path and the first false path;
    dividing the at least one sixth path into a plurality of portions;
    detecting at least one seventh path formed by combining the plurality of portions of the at least one sixth path; and
    detecting, among the at least one seventh path, an eighth path, which is not a true path, as a second false path.

5. A circuit synthesis method according to claim 4, further comprising the step of estimating a delay time period occurring in logic synthesis, ignoring information on the second false path.

6. A circuit synthesis method according to claim 1, further comprising the step of estimating a delay time period occurring in logic synthesis, ignoring the first false path.

7. A recording medium having a program written thereon for causing a computer to execute circuit synthesis, the circuit synthesis being performed by a method comprising the steps of:
    converting a behavioral description describing a behavior of calculation processing into a control data flowgraph;
    assigning each of at least one calculation, at least one input and at least one output in the control data flowgraph into a prescribed time slot;
    assigning the at least one calculation, a plurality of data dependency edges, the at least one input and the at least one ouput respectively to at least one calculation device, at least one register, at least one input pin and at least one output pin;
    generating a plurality of paths corresponding to the plurality of data dependency edges; and
    detecting a first false path among the plurality of paths.

* * * * *